United States Patent [19]

Wasson et al.

[11] 4,105,328

[45] Aug. 8, 1978

[54] METHOD OF AND APPARATUS FOR MANIPULATING LINE WEIGHT IN AN IMAGE

[75] Inventors: Joe R. Wasson, Boulder Creek; Joseph R. Pressley, Menlo Park; Robert W. Baker, Newark; Joseph H. Fairaizl, San Jose; Richard J. Zorker, Santa Clara, all of Calif.

[73] Assignee: The United States of America as represented by the Secretary of the Interior, Washington, D.C.

[21] Appl. No.: 700,701

[22] Filed: Jun. 29, 1976

[51] Int. Cl.² .................. G03B 27/68; G03B 27/02
[52] U.S. Cl. .......................................... 355/78; 355/52
[58] Field of Search ............... 355/78, 132, 133, 86, 355/95, 99, 79, 52, 19, 53; 318/571, 601, 685

[56] References Cited

U.S. PATENT DOCUMENTS

| 3,185,026 | 5/1965 | Carlson et al. | 355/77 |
|---|---|---|---|
| 3,204,544 | 9/1965 | Shannon | 355/133 |
| 4,029,410 | 6/1977 | Richter | 355/52 |

FOREIGN PATENT DOCUMENTS

| 1,390,436 | 5/1975 | United Kingdom | 355/52 |

*Primary Examiner*—L. T. Hix
*Assistant Examiner*—W. J. Brady

*Attorney, Agent, or Firm*—Gersten Sadowsky; Donald A. Gardiner

[57] ABSTRACT

An image-bearing medium (negative or positive) is located over and in close proximity to a light-sensitive film. During exposure, the film is moved in circular orbits parallel to the medium to cause spreading of image lines projected onto the film. To ensure uniform line spreading, the diameter of each successive circular orbit is increased toward a predetermined, maximum diameter, and the film is exposed during each orbit. The film is supported on a mobile table which is mounted, through a frictionless bearing, to a horizontal platform. The platform in turn is keyed to a vertical rotor. As the rotor is rotated by a drive motor, the table is caused to move in a circular orbit about the axis of rotation of the rotor. The diameter of the orbit, determined by the eccentricity of the axis of rotation of the horizontal platform with respect to the axis of rotation of the rotor is precisely controlled by a vertical rack and pinion mechanism. The position of the rack and pinion mechanism is determined by a stepping motor, and the diameter of each orbit is read out directly from a stepping motor encoder. In order to prevent rotation of the table during orbiting, the table rides on an intermediate carriage located between pairs of X- and Y-bearing shafts attached respectively to the bottom of the table and to a fixed frame member. The carriage and bearing shafts restrict the table to rectilinear movement.

16 Claims, 17 Drawing Figures

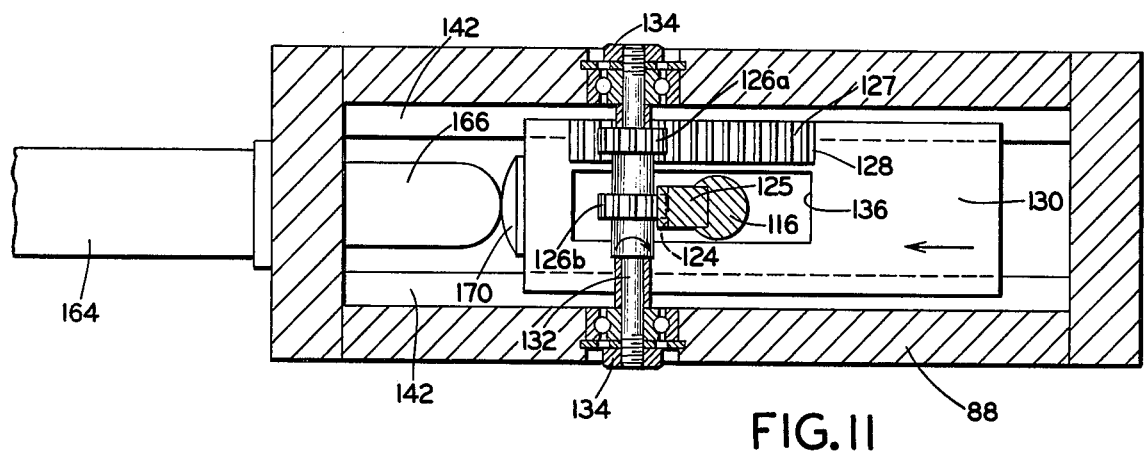
FIG.11
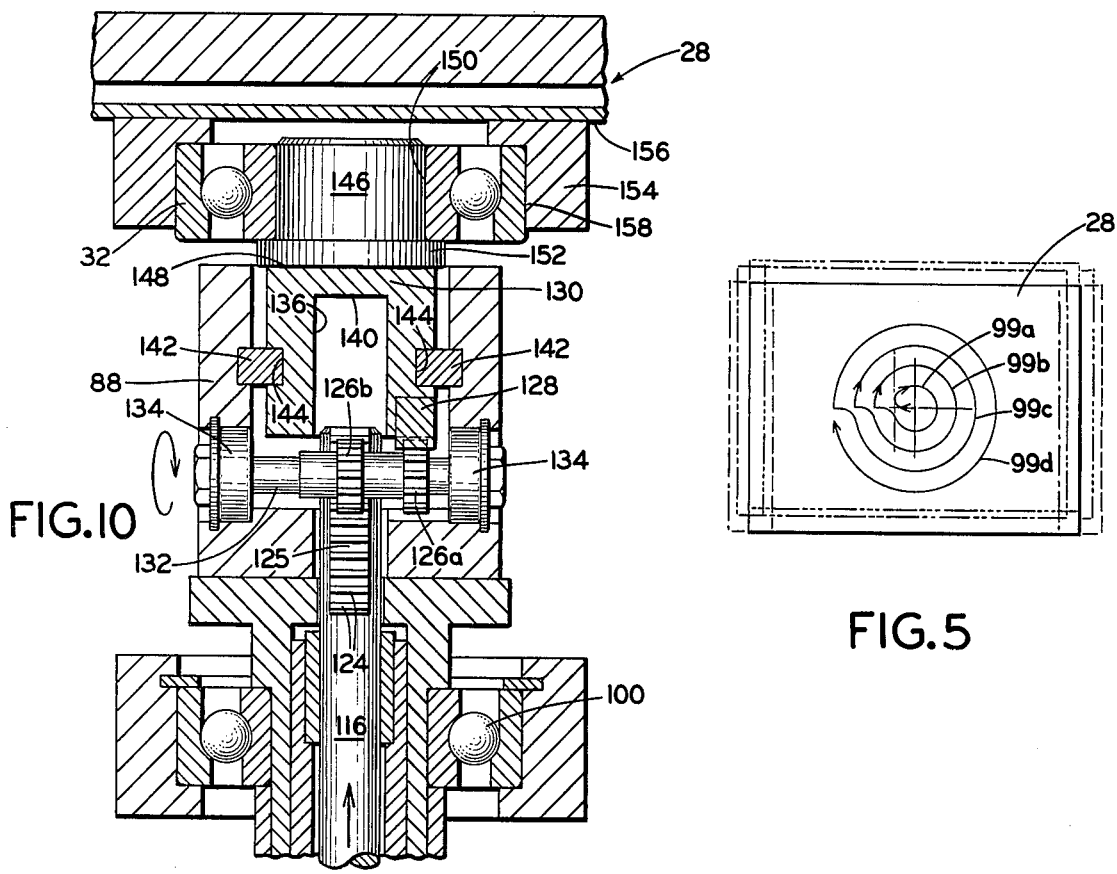
FIG.10
FIG.5
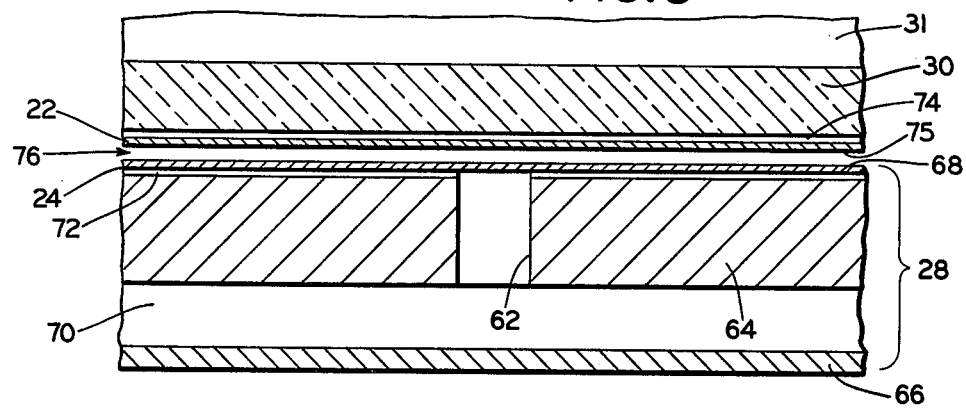
FIG.8

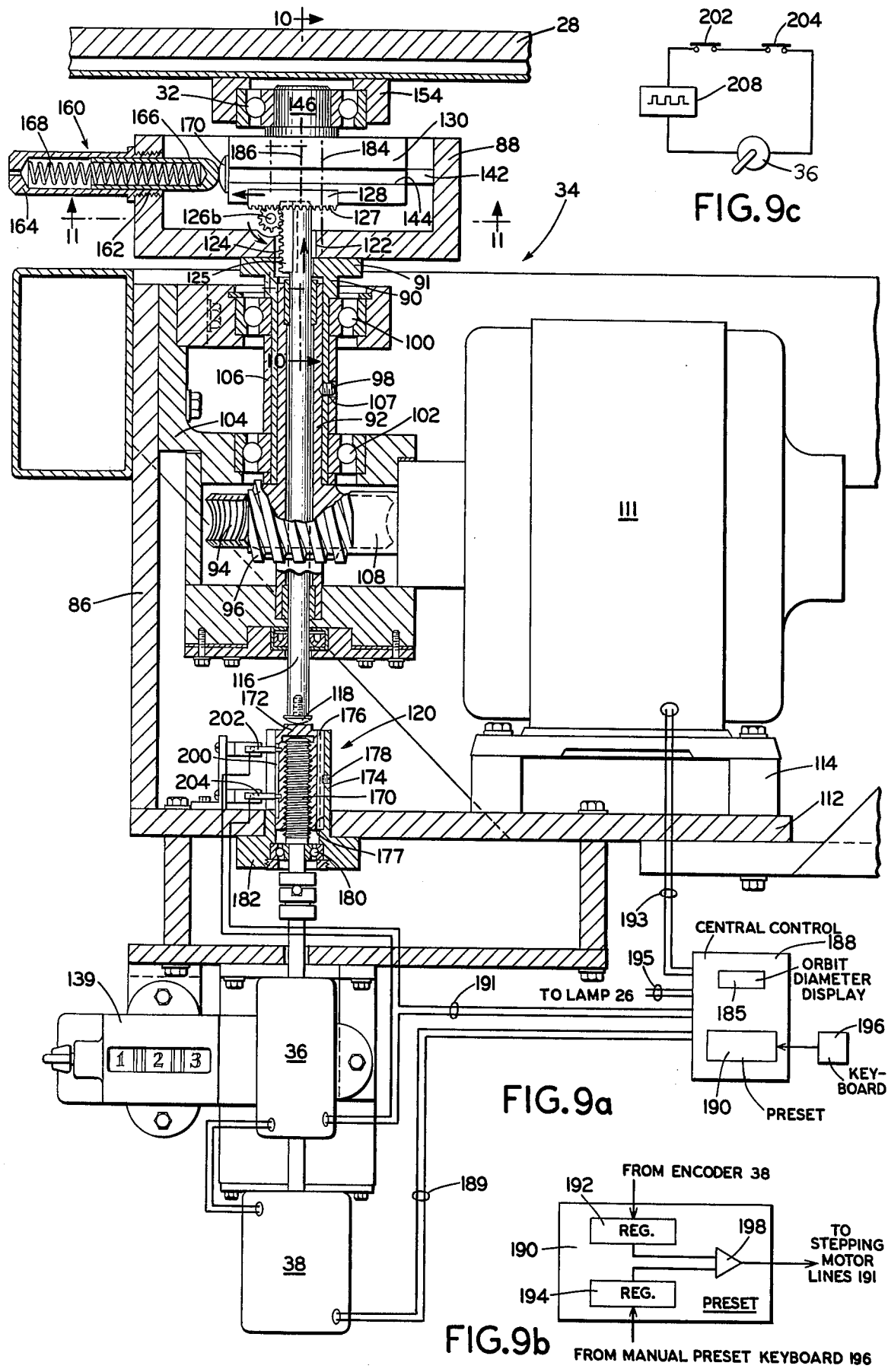

METHOD OF AND APPARATUS FOR MANIPULATING LINE WEIGHT IN AN IMAGE

BACKGROUND OF THE INVENTION

The present invention relates to a method of and apparatus for manipulating line weight in an image representation, and more particularly to a method of and apparatus for spreading or choking contour lines in slope mapping, wherein during exposure, light sensitive film is orbited parallel to an image-bearing positive or negative.

A slope map, defined as one which depicts bands or regions of terrain having a slope greater than or equal to a defined slope, is commonly used in studies related to land use. Typically, up to five or six such bands in different colors are displayed on the slope map representing, for example, terrain slopes ranging from 0 to 5%, from 5 to 15%, from 15 to 30%, from 30 to 50%, from 50 to 70%, and greater than 70%. The map is prepared at a predetermined scale, e.g., 1:24,000.

The slope map is generally prepared from a contour map negative containing contour lines which represent constant altitude regions, with adjacent contour lines representing a predetermined altitude differential, e.g., 10 feet (the contour lines are closer together in steep terrain than they are in relatively flat terrain). In order to form slope maps, the line thickness on a contour map negative is increased by an amount which depends upon map scale, contour interval and desired slope bands. As the contour lines are thickened, contour lines that are spaced close to one another coalesce to form a slope band representative of a region having a slope of at least a preselected value that depends on resultant line thickness. For example, where a relatively high slope band (representing only steep terrain) is required, e.g., 70% and greater, the contour lines are thickened by only a relatively small amount, and only contour lines that are very close to one another tend to coalesce. On the other hand where a relatively low slope band (representing relatively flat terrain as well as steep terrain) is required, e.g., 15% and greater, the contour lines are thickened by a substantial amount. In the latter case, even contour lines that are spaced apart by relatively large distances tend to coalesce.

The process of making a slope map requires first that a second contour map negative be prepared from the original negative with the contour lines thickened by a predetermined amount to define the required slope band. Then, with the contour lines thickened and the slope bands defined, a positive is made from the second negative. During production of the positive, contour lines outside of the slope band are made to undergo a process known as "choke-back", i.e., those contour lines are reduced in thickness until eliminated. Finally another negative is made from the positive depicting only the desired slope band.

The entire process is repeated for each slope band required. In optional additional steps, the original contour lines are superimposed on the negative, along with planographic details, such as roads, houses and the like.

Perhaps the most critical step in the process of slope mapping, as described above, is the step of spreading contour lines to form the desired slope band. In order to prepare a slope map depicting low percentage slope regions, e.g., in the range of 5 to 10%, the contour lines must be spread (thickened) by a substantial amount (up to one-half inch). In the preparation of high percentage slope regions, thickening of the contour lines is less, but must be extremely accurate to prevent unwanted overlap. In both cases, spreading of the contour lines must be uniform and undistorted in order to present an accurate representation of the slope band with a minimum of touching up required.

Although generally somewhat satisfactory for limited line weight manipulating, prior art apparatus of which we are aware are unsuitable for wide line spreading. For example, in U.S. Pat. No. 3,204,544 to Shannon, line spreading is effected by employing a controlled, oscillating, flat table top for supporting photographic film, wherein the movement of the table defines an orbit having a predetermined diameter. Shannon's system is useful for relatively small spreading; for large spreading, however, that system creates anomalies or "frills", that is, spurious edges in the thickened contour lines. The reason for the anomalies and spurious edges is that the table oscillates with a fixed diameter. Painting of the thickened line image onto the photosensitive film is not complete; gaps are left in some of the slope bands and there is loss of detail at the slope edges.

Furthermore, in Shannon, the diameter of the orbit is set by manually adjusting spring tension on a table bearing. Inaccuracies resulting from that type of mechanism would be unsuitable for making slope maps representative of high percentage slope regions, because, as aforementioned, adjacent contour lines may be separated by only about one mil.

In U.S. patent application Ser. No. 610,810 filed Sept. 5, 1975, now U.S. Pat. No. 4,029,410, issued June 14, 1977, assigned to the Assignee of the present invention, a lens orbiting attachment is provided between a cartographic camera and lens thereof. During the exposure, the lens is orbited about the optical axis of the camera in a plane parallel to the image. The diameter of the orbit is continuously stepped between zero, wherein the lens is concentric with the optical axis of the camera, and a predetermined maximum diameter that depends on the amount of line spreading required. That system is generally satisfactory, particularly for depicting low-slope regions, because the lens disposed between the negative or positive and film provides image magnification. In very steep-slope regions, however, and particularly small scale contour maps wherein contour lines may be separated by only one mil, any inaccuracies in the orbiting mechanism, magnified by the lens, makes precise line spreading difficult to obtain.

OBJECTIVES OF THE INVENTION

Accordingly, one object of the present invention is to provide a new and improved method of and system for manipulating line weight in an image representation.

Another object of the present invention is to provide a new and improved method of and apparatus for manipulating line weight in an image representation, wherein lines are thickened by a precisely controlled amount without causing distortion or spurious edges.

Another object of the present invention is to provide a new and improved method of and apparatus for manipulating line thickness in an image representation, wherein a photographic film is orbited relative to a positive or negative during exposure.

Still another object of the present invention is to provide a new and improved method of and apparatus for manipulating line thickness in an image representation, wherein during exposure, a photographic film is orbited in a plane parallel to a positive or negative, and amount of thickening is precisely determined by the orbit diameter.

Yet another object of the present invention is to provide a new and improved method of and apparatus for manipulating line weight in an image, wherein a photographic film is orbited in a plane parallel to a negative or positive, and the diameter of each orbit is successively increased.

Still another object of the present invention is to provide a new and improved method of and apparatus for manipulating line weight in a contour map, wherein line weight manipulation is precisely controlled by a stepping motor.

Yet another object of the present invention is to provide a new and improved method of and apparatus for manipulating line thickness in an image representation, wherein a photographic film is orbited relative to a negative or positive during exposure, and wherein orbit diameter is digitally preset.

Another object of the present invention is to provide a new and improved method of and apparatus for manipulating line thickness in an image representation, wherein a photographic film is orbited relative to a negative or positive during exposure, and wherein orbit diameter is digitally displayed.

Still another object of the present invention is to provide a new and improved method of and apparatus for manipulating line weight in a contour map, wherein during exposure, a rack and pinion mechanism moves a photographic film parallel to a negative or positive in very precisely controlled, predetermined, circular orbits.

BRIEF DESCRIPTION OF A PREFERRED EMBODIMENT

In a method of and apparatus for manipulating line weight in an image representation, and particularly for spreading contour lines in slope mapping, a light-sensitive film is located below and closely adjacent a contour map negative. During exposure of the film to an overhead lamp, the film is moved in circular orbits so that contour lines projected onto the film from the negative are spread or thickened. In order to ensure uniform line spreading, the film is orbited a predetermined number of times at a predetermined, fixed speed depending upon film characteristics and amount of spreading desired. The diameter of each successive orbit is increased toward a final orbit having a predetermined, maximum diameter.

The film is supported on a mobile table that floats on a bearing mounted to a horizontal platform. The platform, in turn, is keyed to a rotor assembly. The table is caused to move in a circular orbit by rotating the rotor with a drive motor. The diameter of the orbit is related to eccentricity between the center of rotation of the platform and the axis of rotation of the rotor.

The center of rotation of the horizontal platform is controlled by an engaging pinion gear. The pinion also engages a vertical push-rod extending concentrically downward within the rotor assembly. Vertical movement of the push-rod turns the pinion gear, and the gear in turn shifts the center of rotation of the horizontal platform.

The lower end of the push-rod is in abutment to the post of a jack screw. The angular position of the jack screw determines the height of the vertical push-rod. Orbit diameter of the table is thus controlled by rotation of the jack screw. Upper and lower limit switches prevent jamming of the jack screw due to exceeding of the jack limits.

The jack screw is rotated by a stepping motor, and a digital encoder, connected to the stepping motor, accurately displays the diameter of orbit by monitoring angular position of the stepping motor rotor. The diameter of each orbit is pre-set by storing digital data representative of a predetermined orbit diameter in a storage register, and supplying the output of the register along with the output of the encoder to a digital comparator between exposures. With the drive motor and lamp off, the stepping motor is turned on to increase orbit diameter. When the data generated by the encoder matches the data stored in the pre-set register, the stepping motor is stopped. The drive motor and lamp are then turned on to orbit the table during exposure.

A mechanical counter displays coarse rotational position of the stepping motor rotor. The counter is used to provide a coarse indication of orbit diameter during set-up, and preserves an indication of orbit diameter during power outages.

In order to prevent rotation of the table during orbiting, a first pair of parallel bearing shafts is connected to the underside of the table. In addition, a second pair of parallel bearing shafts, perpendicular to the table-mounted shafts, is mounted to a stationary support on the floor. Between the two pairs of bearing shafts there is located an intermediate bearing carriage. The intermediate bearing carriage contains sets of wheels that contact the shafts attached to the table as well as the shafts mounted on the stationary support. As a result, during orbiting, the table itself is limited to rectilinear movement; there is no rotation of the table.

In operation, from his knowledge of film characteristics and amount of line spreading or choking required, the operator determines the number of orbits required during exposure of the film and the maximum orbit diameter. The operator then determines the diameter of each of the intermediate orbits. He enters data indicative of the diameter of the first orbit into the storage register in a control panel. While the drive motor is rotating the rotor assembly, the stepping motor increases the eccentricity of the center of rotation of the horizontal platform with respect to the rotor assembly axis until the output of the encoder matches the output of the pre-set storage register. While the film is being exposed to the overhead lamp, the drive motor causes orbiting of the table and film. The operator repeats the orbit setting process for each orbit required, until the last orbit having the predetermined, maximum diameter is completed.

Still other objects and advantages of the present invention will be readily apparent to those skilled in the art from the following detailed description, wherein we have shown and described only the preferred embodiment of the invention, simply by way of illustration of the best modes contemplated by us of carrying out our invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

FIG. 5 is a diagram of a trajectory of the orbit table in accordance with the invention;

FIG. 8 is a cross-sectional view illustrating a vacuum port in the orbit table taken along the line 8—8 in FIG. 3;

FIG. 9a is a cross-sectional side view of a table orbiting mechanism in accordance with the invention;

FIG. 9b is a simplified block diagram of an orbit diameter preset control;

FIG. 9c is a diagram of a jack override circuit used to prevent exceeding of the upper and lower limits of the jack post;

FIG. 10 is a cross-sectional view of a portion of the table orbiting mechanism taken along the line 10—10 in FIG. 9a;

FIG. 11 is a cross-sectional view of another portion of the table orbiting mechanism taken along the line 11—11 in FIG. 9a.

DETAILED DESCRIPTION OF A PREFERRED EMBODIMENT

Figure 1:
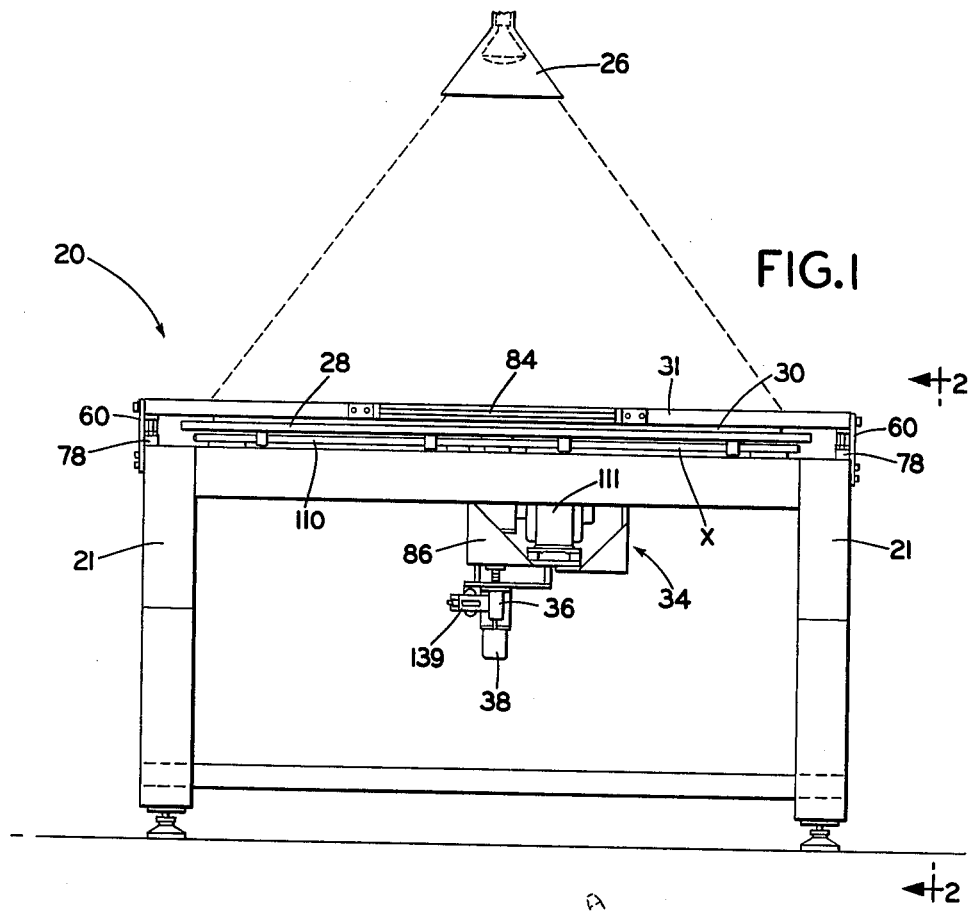
FIG. 1 is a front view of an orbit table assembly and an overhead lamp in accordance with the invention.
Figure 2:
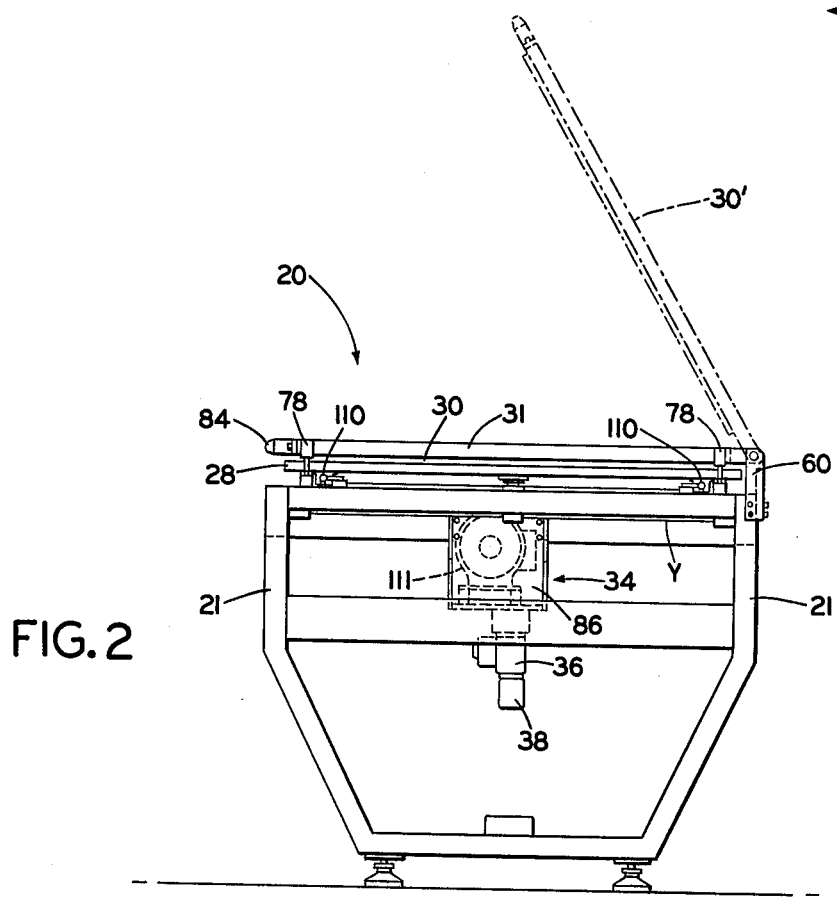
FIG. 2 is an end view of the assembly taken along the line 2—2 in FIG. 1.
Figure 3:
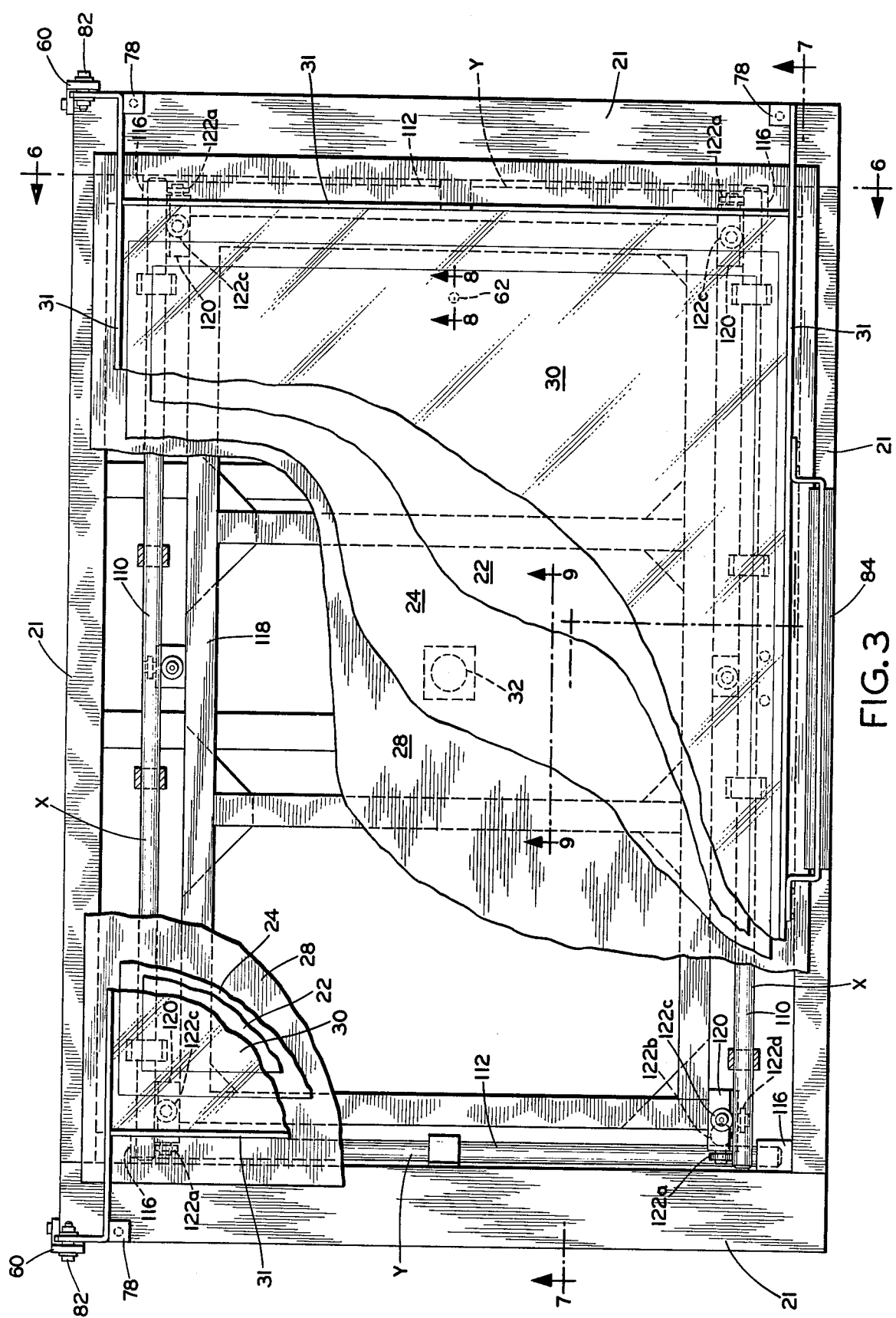
FIG. 3 is a top view of the assembly with portions removed to show details thereof.

Referring to FIGS. 1-3, an apparatus 20, in accordance with the invention, is provided for increasing or decreasing line weight in an image-bearing medium 22 (FIG. 3), such as a photographic negative or positive, by orbiting a light-sensitive film 24 parallel to the medium during exposure of the film to an overhead lamp 26 (FIG. 1). Film 24 is located on an orbit table 28, and image-bearing medium 22 in turn is maintained against the lower surface of a stationary glass plate 30 by a vacuum hold-down means, described below. The medium 22 is oriented parallel to and just above the light-sensitive film so that the film and medium are maintained out of contact with each other.

As an overview, during exposure of film 24 to light from overhead lamp 26, orbit table 28, riding on a low friction bearing 32, is moved in circular orbits of successively increasing diameters by a unique table orbiting mechanism 34. The diameters of the orbits are precisely controlled by stepping motor 36 as a function of film characteristics, and the orbits are continuously monitored for control and display by encoder 38 and counter 139 (FIG. 9a). As the film 24 on table 28 is orbited, image lines projected into the film from medium 22 during exposure tend to spread or thicken. Exposing film 24 during several orbits of successively increasing diameters results in particularly uniform line spreading.

As will become apparent, image line manipulation, practiced in accordance with the present invention, has particular utility in slope mapping (manufacturing a slope map from a contour map). Image-bearing medium 22 shall hereinafter be considered to be a contour map negative bearing an array of contour lines (see FIG. 4a) for the present description. It is to be understood, however, that the principles of the present invention are applicable to manipulation of images in a photographic positive, whereby image line thinning-out (choking) would be effected. It is furthermore to be understood that the present principles are applicable to manipulation of line weight in other applications, e.g., circuit board patterns, relief mapping, symbol discrimination, etc.

A typical contour map negative contains a family of contour lines respectively representing terrain having altitude differentials of predetermined distances. In regions of terrain where slope is large (steep terrain) the contour lines are relatively closely spaced. On the other hand, in regions of terrain that are relatively flat, the contour lines are widely spaced apart. By viewing the contour map, one can quickly obtain a basic knowledge of the flatness or steepness of all the regions of terrain covered by the map.

Slope maps showing areas of critical ranges of terrain slope, i.e., regions where the terrain slope is within a predetermined range, or wherein the terrain slope is greater than the predetermined slope, are particularly useful in studies related to land use. These maps include slope bands identifying predetermined slope regions, and also include contour lines for indicating the altitude. Planographic data, i.e., houses, roads and the like, are also included on the map. By glancing at a slope map, the overall contour of terrain can be readily determined, along with quick identification of regions having a predetermined slope range.

Slope maps are typically generated from a contour map negative. Generally, the contour lines on the contour map negative are spread or thickened by a predetermined amount in order to cause the contour lines in the sloped region to coalesce forming slope bands. A second negative having the thickened contour lines is made from the first negative. Then, the second negative is photographically "choked-back", that is, a positive is generated from the second negative, and contour lines outside the slope bands are eliminated. This process is repeated for each slope band required, and the contour lines are thickened by a different amount for the desired slope region.

Finally, a composite negative is formed with all the slope band regions contained thereon. In optional additional steps, contour lines may be superimposed on the slope bands, and planographic details may be added.

Figure 4A:
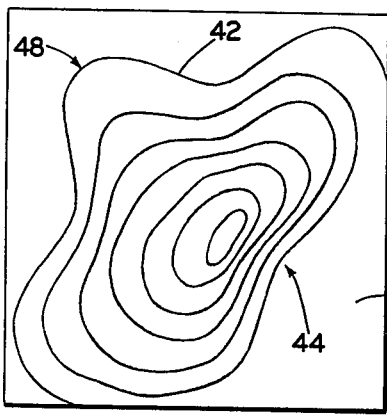
FIGS. 4a-4d are illustrations which help explain the primary steps in development of a slope map from a contour map.

Referring now to FIGS. 4a-4d, and initially to FIG. 4a, a contour map negative 40 contains a family of contour lines 42 representing terrain altitude differentials of predetermined distances, e.g., 10 feet. The contour lines are more closely spaced apart in region 44 than they are, for example, in region 48. Since each contour line represents terrain at a constant altitude, and adjacent contour lines represent 10 feet altitude differentials, it is apparent that terrain in region 44 is steeper (i.e., has a larger percent slope) than the terrain in region 48.

Assuming that it is desired to identify only terrain having a slope greater than 50% for example, and that only region 44 contains such a range of slopes, it is apparent that region 44 can be uniquely identified on a second negative by thickening the contour lines 42 until the contour lines in region 44 coalesce to form continuous band 44' (see FIG. 4b) on negative 40'. The amount by which contour lines 42 on contour map negative 40' are thickened to form lines 42' in the second negative 40' depends on the map scale, the altitude differential represented by adjacent contour lines, and the particular slope regions to be depicted. For example, in a contour map having a scale of 1-24,000, with adjacent contour lines representing 10 feet altitude differential, and with the desired slope region being one depicting terrain slope greater than or equal to 8%, the contour lines are, in practice, spread to a thickness of ⅛ inch. Where 3% slope regions are to be depicted on that map, the contour lines are spread to ⅓ inch.

Figure 4B:
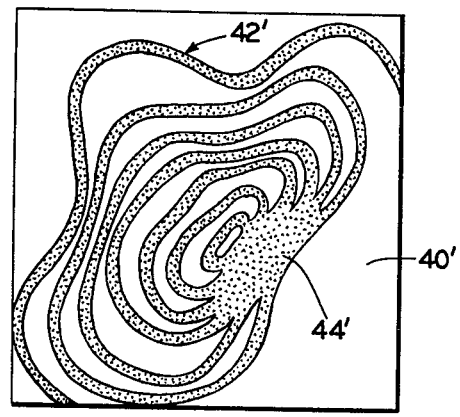

Still referring to FIG. 4b, as aforementioned, contour lines 42, have a thickness whereby the lines in region 44 coalesce to form band 44' depicting terrain slopes greater than or equal to the desired slope. Of course, the contour lines 42' outside the region 44' are also thickened. During formation of a positive 46 (FIG. 4c) from second negative 40', however, the contour lines 42' outside the band 44' are "choked back" (thinned-out) to remove all contour lines extending outside that particular band.

Figure 4C:
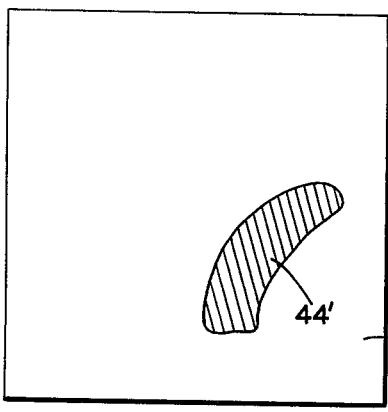
Figure 4D:
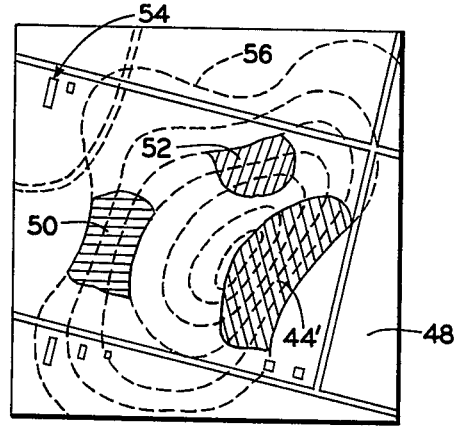

The entire procedure shown in FIGS. 4a-4c is repeated for each desired slope band to be depicted (up to six such bands is considered practical), and a final negative 48 (FIG. 4d) containing slope band 44' and, e.g., additional bands 50 and 52, are produced. Planographic data 54, depicting houses, roads and the like, may be added to negative 48. As an optional final step, contour lines 56, corresponding to lines 42 on negative 40 in FIG. 4a are superimposed on negative 48. Negative 48 can now be used to generate a virtually unlimited number of slope maps containing the terrain data mentioned above.

Referring now to FIGS. 1-3 in more detail, apparatus 20 comprises a main frame 21, orbit table 28 supporting light-sensitive film 24, and stationary glass plate 30 for supporting negative 22 (see FIG. 3). Glass plate 30, within frame 31, is mounted to main frame 21 at hinges 60 so that, using handle 84, the glass plate can be raised to position 30' shown in FIG. 2 to gain access to film 24.

Orbit table 28 is mounted on frictionless bearing 32 that in turn is located on orbiting mechanism 34 described in detail below. A system of vacuum ports (one of said ports is indicated by the numeral 62 in FIG. 3) is provided in orbit table 28 to retain film 24 to the table during orbiting.

There is also provided an array of channels 74 (FIG. 8) on the lower surface of glass plate 30 carrying negative pressure from an external vacuum source (not shown) to retain negative 22 in proper registration against the plate during orbiting of table 28.

During set-up, with plate 30 in the upright position (FIG. 2), film 24, which may be fed to the surface of orbit table 28 from storage roll (not shown) beneath the table, is drawn onto the table. With plate 30 lowered to the downright position (FIG. 1), film 24 is oriented in proper registration to plate 30. Negative 22 is then placed under the lower surface of the glass plate 30 and properly registered. With both negative 22 and film 24 properly registered, the vacuum sources (not shown) associated with orbit table 28 and glass plate 30 are turned on, and the film and negative are attracted respectively to the orbit table and stationary glass plate. The film and negative are thereby maintained parallel to one another and spaced apart so as to be non-contacting.

Referring to FIG. 8, vacuum hold-down means for retaining film 24 in proper registration on orbit table 28 and for retaining negative 22 in proper registration against stationary glass plate 30 are shown in more detail. Orbit table 28 comprises an upper plate member 64 and a lower plate member 66 separated from one another by a vacuum area 70. The area 70 is evacuated by an external vacuum source (not shown). Apertures or ports 62 (see also FIG. 3) extend from upper surface 68 of member 64 to the vacuum area 70.

The upper surface 68 of table member 64 contains an array of surface channels 72 extending between apertures 62. When film 24 is mounted on surface 68 of orbit table 28, as shown, negative pressure in the channels 72 tends to draw the film 24 against the surface 68. As a result, film 24 is retained on orbit table 28 and in proper registration with negative 22 during orbiting.

An array of grooves 74 is formed in the lower surface 75 of glass plate 30, and negative pressure is supplied to the grooves from an external vacuum source (not shown). The negative pressure in grooves 74 tends to retain negative 22 against the lower surface 75 of glass plate 30 when the plate is in the lowered position (FIG. 1). As a result, negative film 22 and film 24 are maintained parallel to one another, and a space 76 is provided between the film and the negative. The space 76 is only large enough to ensure that there is no physical contact between negative 22 and film 24 during orbiting of table 28.

Figure 6:
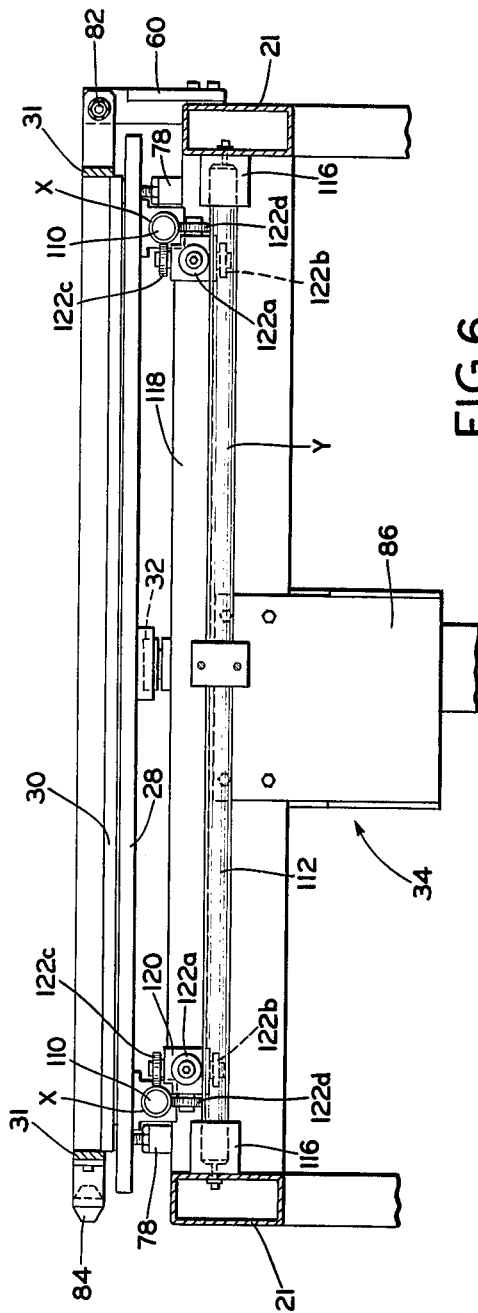
FIG. 6 is a cross-sectional view of the assembly taken along the line 6—6 in FIG. 3.
Figure 7:
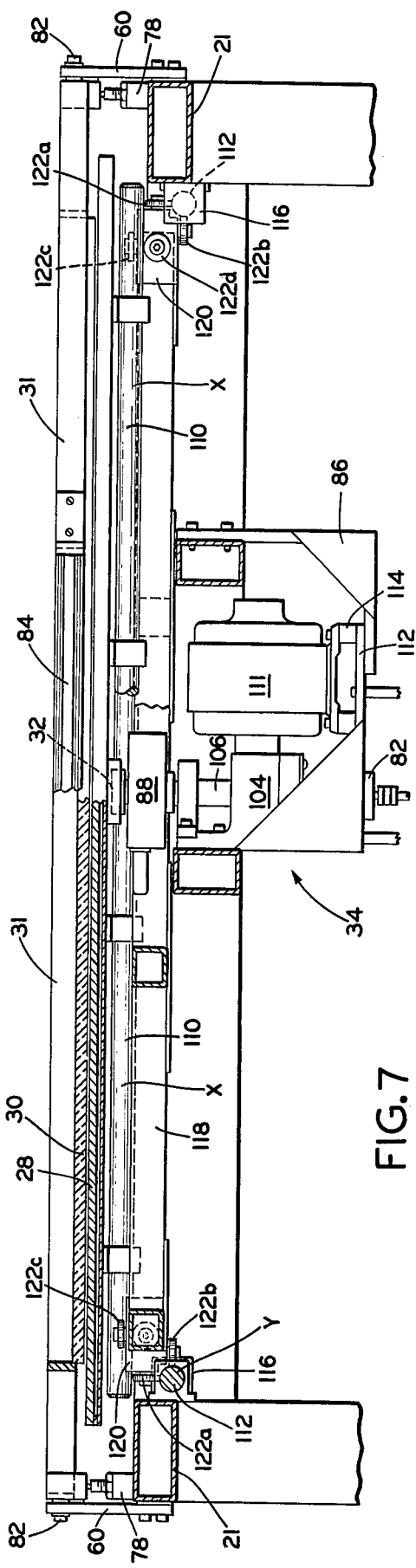
FIG. 7 is a cross-sectional view of the assembly taken along the line 7—7 in FIG. 3.

Referring to FIG. 3, the height and inclination of glass plate 30 with respect to orbit table 28 are controlled by height adjustment screws 78 (see also FIGS. 6 and 7). During initial set-up of a negative 22 and film 24, the four adjustment screws 78 are adjusted so that the film and negative are precisely parallel to one another and as close together as possible without contacting each other. Once proper adjustment of the screws 78 has been made, the screws do not have to be readjusted.

With attention now directed toward FIGS. 6 and 7, plate frame member 31 containing glass plate 30 is mounted to hinges 60 at pivot 82. At the side of glass plate 30 opposite pivot 82, a handle 84 is provided for manually raising and lowering the plate. The glass plate 30 is raised to the upright position (indicated by the numeral 30' in FIG. 2) by gripping handle 84 and swinging the frame 31 upwardly about pivot 82. Hinges 60 are vertically adjustable on main frame 21, and serve as a coarse adjustment of the height of glass plate 30 with respect to the orbit table 28. Some "vertical play" is provided in hinges 60 to yield to fine vertical adjustment by screws 78.

Orbit mechanism 34 is mounted within framework 86, and orbiting table 28 in turn is mounted to the orbiting mechanism on frictionless bearing 32. The purpose of orbit mechanism 34 is to move table 28 in precisely controlled, circular orbits in a plane parallel to film 24 during exposure. Referring now to FIG. 9a, mechanism 34 comprises a rotor 88 mounted on lip portion 91 of sleeve 90. Sleeve 90 in turn is located coaxially around a hollow, inner shaft 92. At its lower end, shaft 92 is integral with worm-wheel 94. The sleeve 90 and inner shaft 92 are coupled together with set screw 98. Worm gear 96 on the output shaft 108 of motor 111 is engaged with worm-wheel 94. Thus, rotation of the worm gear 96 by motor 111 is transferred to rotor 88.

The sleeve 90 is rotatably supported by the inner races respectively of upper and lower bearings 100 and 102. The bearings 100 and 102 are mounted to brace 104. Stationary jacket 106 is mounted over the exterior of sleeve 90. An aperture 107 is formed in the sleeve 90 and jacket 106 to receive the set screw 98.

The drive motor 111, which, in the preferred embodiment, is a conventional D.C. motor such as a Bodine Model 320, is supported on frame member 112 by motor mount 114. The motor mount 114 is preferably resilient to decouple motor vibrations from the frame member 112.

A push-rod 116 extends vertically within the sleeve 92 and is free to slide vertically therein. Head 118 at the lower end of push-rod 116 is mounted on a screw-type jack 120. The upper end of push-rod 116 extends through rotor opening 122 at the axis of rotation 186 of the rotor 88. A set of teeth 124 is formed on vertical rack or block 125 on one side of the push-rod 116 at the upper end thereof (see also FIG. 11). The teeth 124 are maintained in engagement with pinion gear 126b on shaft 132. Also on shaft 132 is second pinion gear 126a maintained in contact with teeth 127 of horizontal rack or block 128. As shown in FIG. 11, block 128 is secured to a horizontal platform 130 mounted within rotor 88 and keyed to rotate therewith.

Referring to FIG. 10, the upper end of push-rod 116 is extendable up into opening 136 in horizontal platform 130, but does not contact the upper surface 140 of opening 136, even when the push-rod 116 is at its uppermost position. Horizontal platform 130 is supported within rotor 88 by a pair of guide keys 142 extending into horizontal channels 144 formed on the sides of the horizontal platform, as shown.

It can thus be appreciated that any vertical movement of push-rod 116 can be translated into horizontal movement of the platform 130. Particularly, as push-rod 116 (FIG. 10) is moved upwardly, shaft 132 is caused, by coupling between pinion gear 126b and teeth 124 on vertical block 125, to rotate counter-clockwise (see arrows in FIGS. 10 and 11). Engagement of counter-clockwise rotating pinion gear 126a and teeth 127 of horizontal rack 128 causes platform 130 to move to the left in FIG. 11 (see arrow). On the other hand, as push-rod 116 is moved downwardly, pinion gears 126a and 126b are rotated clockwise to effect movement of platform 130 to the right in FIG. 11.

Still referring to FIG. 10, a stub shaft 146 is secured to the upper surface 148 of platform 130. The stub shaft 146 is seated within the inner race 150 of bearing 32. Bearing 32 in turn rests on collar portion 152 of stub shaft 146. Circular flange 154, attached to the lower surface 156 of orbit table 28, is mounted on the outer race 158 of bearing 32, and table 28 is thereby freely rotatable about stub shaft 146. The stub shaft 146 is not secured to inner race 150 so that orbit table 28 can be separated from the stub shaft 146, if necessary, by lifting.

Referring to FIG. 9a, an anti-backlash plunger 160 is mounted to rotor 88 at threaded bore 162. The plunger 160 comprises a stationary casing 164 and an armature 166 disposed within the casing. A coil spring 168, located within casing 164, exerts an outward force against armature 166. The armature 166 is thus maintained biased against head 170 of horizontal platform 130. The constant loading of platform 130 by plunger 160 minimizes backlash of the rack 125 and the rack 128 and of pinion gears 126a and 126b. Prevention of backlash is particularly important to avoid error in the diameter of orbit table 28 during exposure, and to avoid an erratic trajectory of the table that might create anomalies in the slope map.

Jack 120 (FIG. 9a) comprises a screw 170 threaded within a moveable jack post 172. Jack post 172 in turn is contained within stationary member 174. Jack post 172 is free to slide vertically within stationary member 174, but is constrained agaist rotation by key 176 formed in the jack post 172. The key 176 is a vertical rib formed in the outer surface of post 172, and is seated in a corresponding vertical channel 177 formed on the inner surface of stationary member 174. A set screw 178 is provided to secure the vertical position of post 172, if desired.

Jack screw 172 is rotatably mounted to base portion 182 of stationary member 174 with bearing 180. Rotation of screw 170 within bearing 180 causes jack post 172 to move vertically within the member 174, and the distance moved is a function of the number of threads per inch on the screw. In the preferred embodiment, a screw having forty threads per inch is provided; accordingly, jack post 172 is moved 0.025 inch upwardly for each clockwise revolution of screw 170, and is similarly moved 0.025 inch downwardly for each counter-clockwise revolution of the screw 170.

As aforementioned, head 118 of push-rod 116 is supported on the upper end of jack post 172 whereby the vertical position of push-rod 116 is thus located as a function of rotation of screw 170. The horizontal position of platform 130 is also controlled as a function of rotation of screw 170. For example, when screw 170 is rotated clockwise to cause jack post 172 to move upwardly, push-rod 116 is caused to slide upwardly within sleeve 92. Vertical block 125 rotates pinion gear 126b counter-clockwise (see arrow in FIG. 9a). Counter-clockwise rotation of adjacent pinion gear 126a in turn shifts horizontal platform 130 to the left (see arrow). On the other hand, as screw 172 is rotated in the opposite direction (clockwise) so as to cause push-rod 116 to move downwardly, platform 130 is shifted to the right.

It is apparent that at some rotational position of screw 172, the center of rotation 184 of horizontal platform 130 is concentric to the center of rotation 186 of rotor 88. At only that rotational position of screw 172, as platform 130 along with rotor 88 is rotated by motor 111, orbit table 28 remains stationary about rotor axis 186; there is no orbiting of the table about the rotor axis. On the other hand, as screw 172 is rotated, platform axis 184 becomes displaced from rotor axis 186, as shown in FIG. 9a, and the amount of eccentricity between the two axes depends on the amount of rotation of the screw 172. As rotor 88 is rotated by motor 111, platform 130 is moved in a circular orbit about the center of rotation 186 of rotor 88. The diameter of the circular orbit is equal to twice the displacement between the center of rotation 186 of the rotor 88 and the center of rotation 184 of platform 130. Table 28, mounted to stub shaft 146 on platform 130, rides above the platform on frictionless bearing 32 during rotation. Rotation of table 28 during orbiting due to imperfect rotational decoupling through bearing 32 is prevented by an intermediate carriage 118 described below.

Screw 172 of jack 120 is coupled to stepping motor 36 that controls rotation of the screw. The stepping motor 36 is a conventional, digitally controlled stepping motor, such as the SLO-SYN Model H550 having 200 steps per revolution and approximately 150 inch ounces of torque. The resolution (one step) of stepping motor 36 thus is 1/200 of a revolution or 1.80. One step of stepping motor 36 indexes push-rod 116 a distance of 0.1 mil; the push-rod is vertically indexed 1 mil by supplying 10 stepping pulses to stepping motor 36. Vertical indexing of push-rod 116 is translated one-to-one to horizontal indexing of platform 130, 10 stepping pulses supplied to the stepping motor 36 thus indexes the diameter of orbit table 28 by 1 mil.

The rotation of stepping motor 36 is monitored by conventional digital encoder 38 that converts the rotational position of the rotor (not shown) of the stepping motor 36 to a digital signal, and by a mechanical counter 139. The encoder 38 may be, for example, a DRC 1000 encoder which generates 200 counts per revolution of the rotor of the stepping motor.

The utilization of stepping motor 36 in combination with mechanism 34 provides control of orbit diameter that is substantially more precise than was heretofore possible. Furthermore, the provision of digital signals both for controlling and monitoring the orbit diameter is compatable for control by digital computer, as well as by central control unit 188, described below.

Referring again to FIG. 9a, a vertical channel 200 is formed in the outer surface of jack post 172. Disposed within the channel 200 and extending through stationary member 174 are upper limit switch 202 and lower limit switch 204. Referring to FIG. 9c, limit switches 202 and 204 are connected in series to each other, to pulse generator (located in central control unit 188), and to stepping motor 36. Limit switches 202 and 204 are normally closed switches. So long as neither switch 202 or 204 is actuated (open), stepping motor 36 may be driven by pulse generator 208. On the other hand, if either limit switch 202 or 204 is actuated, stepping motor 36 is disconnected from generator 208.

With jack post 172 positioned within the upper and lower limits thereof, limit switches 202 and 204 are located within channel 200 in the wall of the jack post, and the switches are de-energized. As jack post 172 is indexed upwardly to its upper limit, limit switch 204 is actuated by contacting the lower end of channel 200, turning off stepping motor 36. On the other hand, as jack post 172 is indexed downwardly to its lower limit, limit switch 202 is actuated by contacting the upper end of channel 200, again turning off stepping motor 36. It can be appreciated therefore that stepping motor 36 is prevented from advancing jack post 172 beyond either the upper or lower limits thereof, even if the operator inadvertently makes such a request at central control 188. Any jamming of jack post 172 caused by exceeding the upper and lower limits thereof is thereby eliminated.

Stepping motor 36 as well as drive motor 111 is controlled by a central control unit 188. Central control unit 188 supplies stepping pulses to stepping motor 36 through lines 191 and monitors the output of encoder 38 through lines 189.

Orbit diameter is displayed in decimal on display 185. A binary to decimal converter (not shown) is included in central control 188 to convert the output of encoder 38 to a decimal signal for display. Orbit diameter is also displayed on counter 139, mechanically coupled to be responsive to the rotor of stepping motor 36. Counter 139 provides a coarse indication of orbit diameter, and is useful during set-up when orbit data are being determined. Counter 139 also preserves an indication of orbit diameter during temporary power outages.

D.C. power is supplied to drive motor 111 by central control unit 188 through lines 193 and lines 195 are provided to energize overhead lamp 29 (FIG. 1).

Central control 188 includes a conventional stepping motor pre-set indexer 190 such as the SLO - SYN Model ST-1800-B-5. Referring to FIG. 9b, pre-set indexer 190 contains a first storage register 192 for storing a digital representation of the rotor position of stepping motor 36, generated by encoder 38, and a second storage register 194 for storing a second digital signal representing a pre-set orbit diameter. The pre-set signal may be generated by a conventional keyboard 196, for example, by a program, or by any other suitable input device.

When stepping motor 36 is turned on to adjust the diameter of orbit table 28 toward a pre-set diameter, the digital signal stored in register 192 increases toward the pre-set signal in register 194. The outputs of registers 192 and 194 are compared in a comparator 198. Where there is a favorable comparison between the two digital signals indicating that the diameter of the orbit is equal to the pre-set diameter, the output of comparator 198 is supplied to turn off stepping motor 36 so that the diameter of orbit of table 28 is fixed at the pre-set diameter.

In operation, from the characteristics of film 24, the operator determines the number of orbits of table 28 to be made during exposure, and the diameter of each orbit. The diameter of the first orbit is manually entered into keyboard 196, and the keyboard supplies a corresponding digital signal to storage register 194. Stepping motor 36 is pulse-energized by control panel 188 along lines 191, and table 28 is indexed horizontally. When the eccentricity or displacement of the center of rotation 184 of platform 130 with respect to the center of rotation 186 of rotor 88 supplied to register 194 corresponds to the pre-set orbit diameter stored in register 192, comparator 198 generates a signal to de-energize stepping motor 36 (although not shown, comparator 198 may, for example, control a relay in series with line 191 in FIG. 9a). Lamp 26 is then turned on and drive motor 111 is energized by control 188 to cause table 28 to make one complete circular orbit during an exposure.

The operator now eneters the next predetermined orbit diameter into the keyboard 196 and, during another exposure, the orbit table 28 is caused to move in a circular orbit having the second predetermined diameter. The procedure is repeated until, during a final exposure, table 28 is moved in a circular orbit having a pre-set maximum diameter.

The resultant trajectory of table 28 is summarized in FIG. 5, wherein table 28 is initially indexed by stepping motor 36 to the first pre-set orbit 99a. After table 28 is moved along orbit 99a by drive motor 111, the table is further indexed to the second preset orbit 99b, and moved along that orbit by drive motor 111. The procedure is repeated for orbits 99c and 99d. During each orbit, film 24 on table 28 is exposed to negative 22 and overhead lamp 26. Table 28 does not rotate during orbiting, as symbolized by the dotted outlines of the table 28 in FIG. 5.

Figure 12:
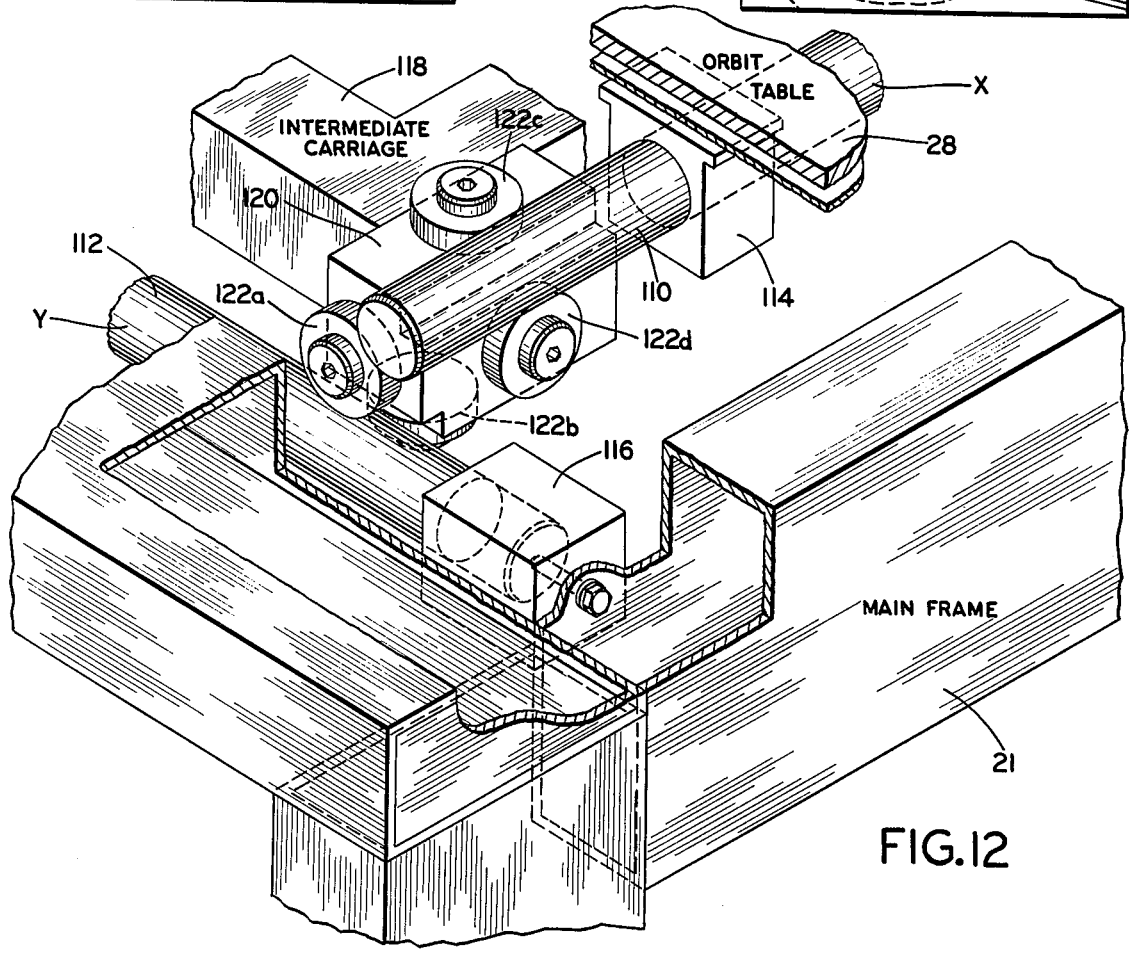
FIG. 12 is a perspective view of a portion of an intermediate carriage and bearing shaft assembly in accordance with the invention for preventing rotation of the table during orbiting.

Rotation of the table 28 during orbiting is prevented by means of an X- and Y-bearing shafts in cooperation with intermediate bearing table 118, as shown generally in FIG. 12. Referring also to FIGS. 6 and 7, table 28 has connected thereto a pair of X-bearing shafts 110. Shafts 110 are located respectively at opposite sides of the lower surface of orbit table 28, and are parallel to each other. A pair of Y-bearing shafts 112 are connected to the upper surface of main frame 21. Shafts 112 are parallel to each other, and orthogonal to the shafts 110. As shown in FIG. 12, X-shafts 110 and Y-shafts 112 are cylindrical and are mounted respectively to the orbit table 28 and main frame 21 with bearing blocks 114 and 116.

Disposed vertically between X-shafts 110 and Y-shafts 112 is the intermediate bearing carriage 118. At each corner of intermediate carriage 118 there is a roller assembly 120 comprising orthogonal wheels 122a–d. Intermediate carriage 118 is mounted on Y-bearing shafts 112 of main frame 21 with wheels 122a and 122b. Orbit table 28 in turn is mounted on X-bearing shafts 110 of carriage 118 with bearing wheels 122c and 122d.

Orbit table 28 is thus freely moveable in the X- and Y-directions, but is limited to rectilinear movement; the table is prevented from rotating. Movement of the table 28 on the Y-direction is effected by the intermediate carriage 118 riding along Y-bearing shafts 112. Movement of the table 28 in the X-direction, on the other hand, is effected by orbit table 28 riding along the X-bearing shafts 110. During orbiting of table 28, with the table limited to rectilinear movement, there is continuous movement of the table in the X-direction about X-shaft 110 and in the Y-direction about Y-shaft 112, and the vector summation of the X and Y rectilinear movements describes the circular orbit of table 28. The motion is described by the following formula:

$$\Delta x^2 + \Delta Y^2 = \tfrac{1}{4} D^2$$

Where:
$\Delta X$ is displacement along X-bearing shaft 110;
$\Delta Y$ is displacement along Y-bearing shaft 112; and
$\Delta D$ is displacement along an orbit having a diameter D.

In summary, there is provided a precisely controlled orbiting table 28 for moving photographic film 24 in a circular orbit with respect to a stationary negative (or positive) 22 during exposure of the film to cause spreading of image lines. The diameter of each orbit is accurately controlled by an orbit control mechanism 34 and stepping motor 36, and the diameter of each successive orbit is increased toward a predetermined maximum diameter. Each predetermined diameter is entered into control unit 188 from keyboard 196 to cause stepping motor 36 to advance orbit mechanism 34 so that the horizontal position of platform 130 of mechanism 34 corresponds to the predetermined diameter. Drive motor 111 orbits table 28 by rotating rotor 88, and eccentricity between axes 184 and 186 determines orbit diameter. The diameter of each orbit is continuously monitored by encoder 36. In the embodiment described, each orbit diameter is successively keyboard-entered by the operator as needed. It is to be understood, however, that stepping motor 36 and drive motor 110 could alternatively be controlled by a programmed, general-purpose computer having stored therein the predetermined diameter of each orbit, wherein the computer is responsive to the output of encoder 38 and, as well as, to limit switches 202 and 204 to perform the functions described herein.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

What is claimed is:

1. An apparatus for precisely manipulating line weight in an image, comprising:
first means including a stationary frame member for supporting an image carrier;
second means including a mobile table for supporting a light-sensitive film parallel to and adjacent said image carrier;
third means for causing relative orbital movement between said film and said image carrier to cause uniform and undistorted spreading of image lines projected onto said film during an exposure as a result of an integral stepwise change of orbital diameter of said orbital movement, said third means including a horizontal platform supporting said mobile table, rotary bearing means being disposed between said table and said platform to permit rotation of said platform relative to said table; and rotor means for orbiting said table by rotating said platform about an axis of rotation thereof, a displacement of said axis of rotation of said platform with respect to an axis of rotation of said rotor means being determinative of orbit diameter;
restraining means for preventing rotation of said mobile table during rotation of said rotor means, said restraining means including first shaft means secured to said table; second shaft means secured to a stationary support, said second shaft means being orthogonal to said first shaft means; and a carriage disposed between and maintained in contact with said first and second shaft means, movement of said table being thereby limited to rectilinear movement; and
stepping motor means for controlling said stepwise change of orbital diameter to occur in a linear manner.

2. The apparatus of claim 1, wherein said rotor means includes a rotor assembly and a motor for rotating said rotor assembly.

3. The apparatus of claim 1, including wheel means attached to said carriage and adapted to ride along said first and second shaft means.

4. The apparatus of claim 1, including readout means for displaying orbit diameter.

5. The apparatus of claim 4, including storage register means for storing a second digital signal representative of a predetermined orbit diameter.

6. The apparatus of claim 5, including comparator means for comparing said first and second digital signals; and control means for advancing the rotor of said stepping motor to an angular position corresponding to the predetermined orbit determined by an output of said comparator means.

7. The apparatus of claim 4, wherein said readout means includes a decimal display responsive to said encoder for displaying instantaneous orbit diameter.

8. The apparatus of claim 7, wherein said readout means further includes a mechanical counter coupled to said stepping motor for displaying a coarse indication of orbit diameter.

9. The apparatus of claim 1, wherein said stepping motor means includes a rotor, further including encoder means for converting an angular position of said rotor to a first digital signal.

10. The apparatus of claim 1, wherein said mobile table includes vacuum hold-down means for retaining said film in place on said table during orbiting.

11. An apparatus for precisely manipulating line weight in an image, comprising:
first means including a stationary frame member for supporting an image carrier;

second means including a mobile table for supporting a light-sensitive film parallel to and adjacent said image carrier;

third means for causing relative orbital movement between said film and said image carrier to cause uniform and undistorted spreading of image lines projected onto said film during an exposure, as a result of an integral stepwise change of orbital diameter of said orbital movement, said third means including a horizontal platform supporting said mobile table, a pinion means drivingly engaging said horizontal platform; a vertical rack member drivingly engaging said pinion means, rotary bearing means being disposed between said table and said platform to permit rotation of said platform relative to said table; and rotor means for orbiting said table by rotating said platform about an axis of rotation thereof, whereby a displacement of said axis of rotation of said platform with respect to axis of rotation of said rotor means being determinative of orbit diameter and said displacement being determined by a height of said vertical rack member;

steping motor means for controlling said stepwise change of orbital diameter to occur in a linear manner, said stepping motor means including a stepping motor, and means for coupling said stepping motor to said vertical rack member.

12. The apparatus of claim 11, wherein said coupling means includes jack means for controlling the height of said vertical rack member as a function of an output of said stepping motor.

13. The apparatus of claim 12, wherein said jack means includes a rotary jack including a lift screw in engagement with a jack post, a lower end of said vertical member abutting said post, said screw being rotated by said stepping motor.

14. The apparatus of claim 11, wherein said vertical rack member is located along the axis of said rotor means.

15. The apparatus of claim 11, including antibacklash means resiliently biased against said horizontal platform.

16. The apparatus of claim 15, wherein said anti-backlash means includes a plunger member, and spring means for biasing said plunger member against said horizontal platform.

* * * * *